(12) United States Patent
Yamamura

(10) Patent No.: US 7,728,389 B2
(45) Date of Patent: Jun. 1, 2010

(54) SEMICONDUCTOR DEVICE AND FABRICATION METHOD FOR THE SEMICONDUCTOR DEVICE

(75) Inventor: Takuji Yamamura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/351,318

(22) Filed: Jan. 9, 2009

(65) Prior Publication Data

US 2009/0242947 A1 Oct. 1, 2009

(30) Foreign Application Priority Data

Mar. 31, 2008 (JP) ............................. 2008-091225
Dec. 2, 2008 (JP) ............................. 2008-307290

(51) Int. Cl.
*H01L 23/62* (2006.01)

(52) U.S. Cl. ............................. 257/385; 257/E23.116; 257/E23.123; 257/632

(58) Field of Classification Search ................. 257/385, 257/389, 401, 632, 635–640, 728, E23.116, 257/E23.123, E23.125, E23.128, E23.132, 257/E23.134; 438/125
See application file for complete search history.

(56) References Cited

U.S. PATENT DOCUMENTS 7,259,678 B2 * 8/2007 Brown et al. ............. 340/572.8

FOREIGN PATENT DOCUMENTS

| EP | 0 373 360 B1 | 10/1995 |
|---|---|---|
| EP | 0 595 298 B1 | 1/1998 |
| JP | 60-224231 | 11/1985 |
| JP | 6-140440 | 5/1994 |
| JP | 11-354540 | 12/1999 |
| JP | 2008-13721 | 1/2008 |
| WO | WO 2006/077565 A1 | 7/2006 |

* cited by examiner

*Primary Examiner*—Zandra Smith
*Assistant Examiner*—Paul E Patton
(74) *Attorney, Agent, or Firm*—Oblon, Spivak, McClelland, Maier & Neustadt, L.L.P.

(57) ABSTRACT

A semiconductor device and a fabrication method for the semiconductor device which can remove the sacrifice layer deposited on the semiconductor device surface in a short time and whose manufacturing yield can be improved are provided. The semiconductor device and the fabrication method for the semiconductor device includes a field effect transistor 4 including a gate electrode 1, a drain electrode 2, and a source electrode 3 formed on a semiconductor substrate; and a hollow protective film 5 for covering the gate electrode 1, the drain electrode 2, and the source electrode 3, and being provided on the semiconductor substrate 4A. The hollow protective film 5 includes a 1st cap layer 7; a second cap layer 10 placed on the first cap layer 7; a plurality of openings 12 formed on the position of the first cap layer 7 of the upper part of the drain electrode 2 and the source electrode 3; a sealed part 12A for sealing the openings 12 by the second cap layer 10, wherein oxygen plasma is supplied through the openings 12, and ashing removal of the sacrifice layer 6 is performed.

9 Claims, 20 Drawing Sheets

SEMICONDUCTOR DEVICE AND FABRICATION METHOD FOR THE SEMICONDUCTOR DEVICE

CROSS REFERENCE TO RELATED APPLICATION AND INCORPORATION BY REFERENCE

This application is based upon and claims the benefit of priority from prior Japanese Patent Application No. P2008-91225 filed on Mar. 31, 2008, and No. P2008-307290 filed on Dec. 2, 2008 the entire contents of which are incorporated herein by reference.

BACKGROUND OF THE INVENTION

1. Field of the Invention

The present invention relates to a semiconductor device and a fabrication method for the semiconductor device. In particular, the present invention relates to a semiconductor device and a fabrication method for the semiconductor device provided with a package of a wafer level, in a package of a high frequency semiconductor device.

2. Description of the Related Art

In a field effect transistor applied to a high frequency semiconductor device, in order to keep airtightness, packaging is achieved by placing a semiconductor device, a matching circuit, etc. in housing composed of metal, ceramics, etc.

However, the cost concerning the housing of this package was large, and this had become an obstacle of low-pricing in the cost aspect of the semiconductor device. Moreover, in potting by resin etc., the problem that gain reduction occurred by the increase in capacity of a gate electrode had occurred.

As technology for solving this problem, a wafer level packaging which can keep the airtightness to the semiconductor device itself with a hollow protective film, and can reduce the capacity of a gate electrode is developed and filed as patent application by the present applicant (Japanese Patent Application No. P2008-013721).

However, since the volume of hollow sections was large in order to wrap an active part of the field effect transistor by using this technology, there was a problem that it is anxious about the mechanical strength of the protective film.

On the other hand, in order to reduce the increase in the capacity by a passivation film, a semiconductor device and a fabrication method for the semiconductor device which provided a hollow area between the passivation film and a metal electrode which a high frequency signal outputs and inputs, is already disclosed (for example, refer to Patent Document 1).

On the other hand, a semiconductor device and a fabrication method for the semiconductor device which reduces the parasitic capacitance between a source electrode or a drain electrode, and a gate electrode, and improves high frequency characteristics by removing an insulating film under the eaves of the gate electrode toward a mold are already disclosed (for example, refer to Patent Document 2).

Patent document 1:
  Japanese Patent Application Laying-Open Publication No. H06-140440
Patent document 2:
  Japanese Patent Application Laying-Open Publication No. H11-354540

SUMMARY OF THE INVENTION

According to an aspect of the invention, a semiconductor device comprises a semiconductor substrate; a field effect transistor comprising a gate electrode, a drain electrode, and a source electrode which are formed on the semiconductor substrate; and a hollow protective film for covering the gate electrode, the drain electrode, and the source electrode of the field effect transistor, and provided on the semiconductor substrate, wherein the hollow protective film comprises a first cap layer; a second cap layer placed on the first cap layer; a plurality of openings formed in the position of the first cap layer of an upper part of the drain electrode and the source electrode; and a sealed part for sealing the openings by the second cap layer.

According to another aspect of the invention, a semiconductor device comprises a semiconductor substrate; a field effect transistor comprising a gate electrode, a drain electrode, and a source electrode which are formed on the semiconductor substrate; and a hollow protective film for covering the gate electrode, the drain electrode, and the source electrode of the field effect transistor, and provided on the semiconductor substrate, wherein the hollow protective film comprises a first cap layer; a second cap layer placed on the first cap layer; a plurality of openings formed in the position of the first cap layer of an upper part of one of the drain electrode and the source electrode; and a sealed part for sealing the openings by the second cap layer.

According to another aspect of the invention, a fabrication method for a semiconductor device comprises forming a field effect transistor comprising a source electrode, a gate electrode, and a drain electrode on a semiconductor substrate; forming a sacrifice layer on the surface of the field effect transistor so that an active part of the source electrode, the gate electrode, and the drain electrode is covered; forming a first cap layer on the sacrifice layer; forming a plurality of openings for removing the sacrifice layer in an upper position of the drain electrode and the source electrode of the first cap layer; removing the sacrifice layer through the plurality of openings; and sealing the plurality of openings after removing the sacrifice layer.

According to another aspect of the invention, a fabrication method for the semiconductor device comprising forming a field effect transistor comprising a source electrode, a gate electrode, and a drain electrode on a semiconductor substrate; forming a sacrifice layer on the surface of the field effect transistor so that an active part of the source electrode, the gate electrode, and the drain electrode is covered; forming a first cap layer on the sacrifice layer; forming a plurality of openings for removing the sacrifice layer in the upper position of anyone of the drain electrode and the source electrode of the first cap layer; removing the sacrifice layer through the plurality of openings; and sealing the plurality of openings after removing the sacrifice layer.

DETAILED DESCRIPTION OF THE EMBODIMENTS

Figure 1:
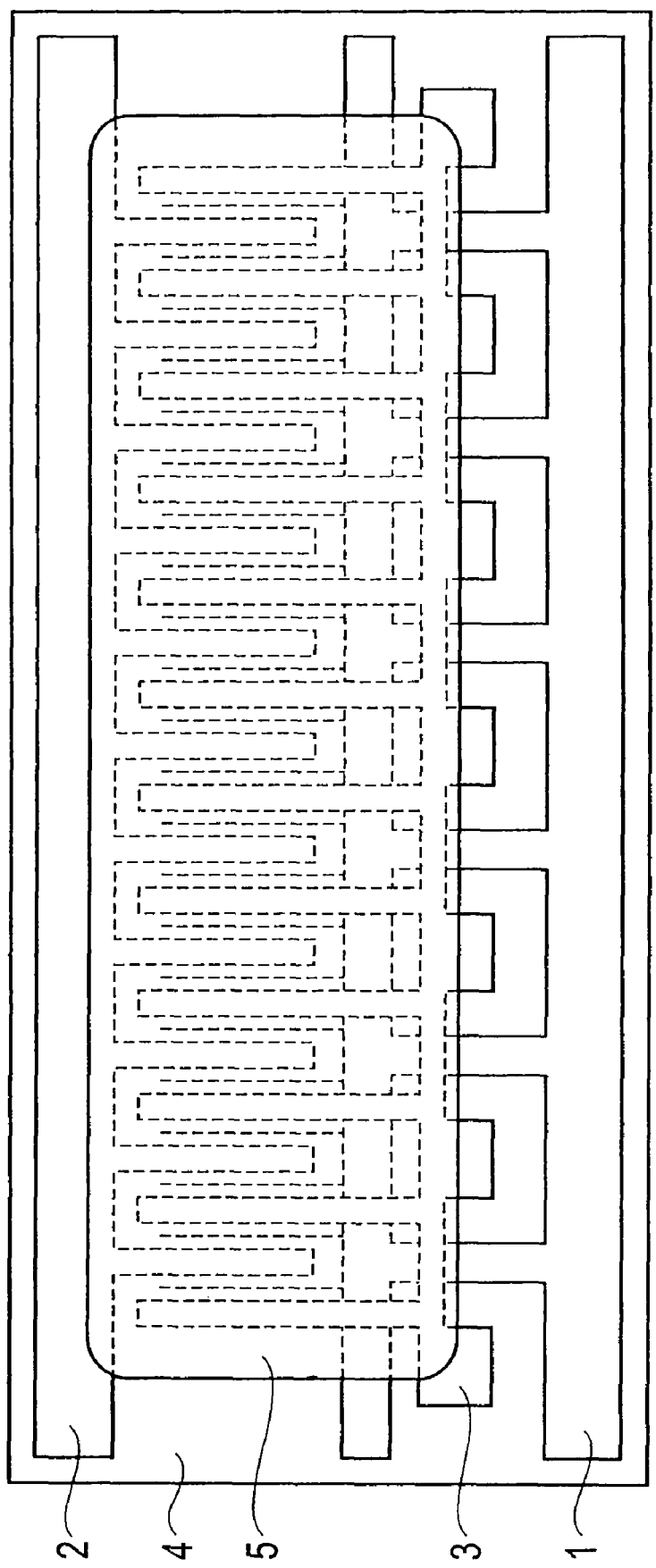
FIG. 1 is a schematic plane pattern configuration diagram showing a semiconductor device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is in the representation of the cross-sectional diagram, it will be appreciated that the various drawings are not drawn to scale from one figure to another nor inside a given figure, and in particular that the circuit diagrams are arbitrarily drawn for facilitating the reading of the drawings. In the following descriptions, numerous specific details are set forth such as specific material layers, etc. to provide a thorough understanding of the present invention. However, it will be obvious to those skilled in the art that the present invention may be practiced without such specific details. In other instances, the material layers well-known have been shown in the cross-sectional diagrams form in order to not obscure the present invention with unnecessary detail. Drawings are schematic, not actual, and may be inconsistent in between in scale, ratio, etc.

The embodiments shown below exemplify a semiconductor device that are used to implement the technical ideas according to the present invention, and do not limit the technical ideas according to the present invention to those that appear below. These technical ideas, according to the present invention, may receive a variety of modifications that fall within the claims.

The embodiment shown in the following exemplifies the device and method for materializing the technical idea of this invention, and this embodiment of the invention does not specify assignment of each component parts, etc. as the following. This embodiment of the invention can add various change in scope of claims.

First Embodiment

Device Structure

Figure 2:
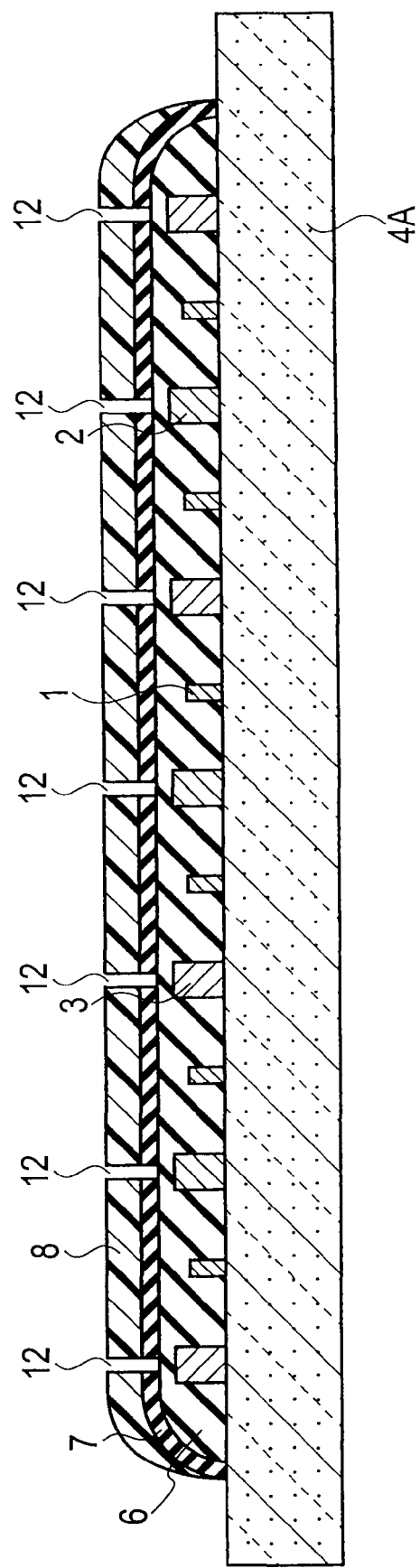
FIG. 2 is a schematic cross-sectional configuration chart explaining one process of a fabrication method of the semiconductor device according to the first embodiment of the present invention.
Figure 3:
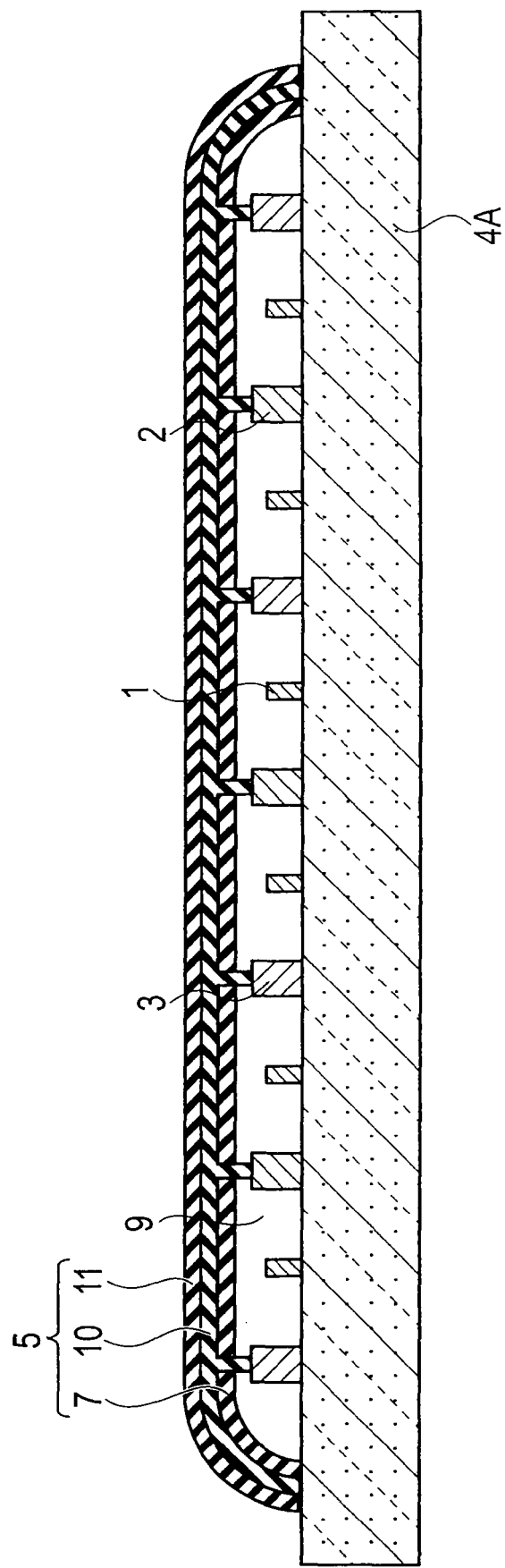
FIG. 3 is a schematic cross-sectional configuration chart explaining one process of the fabrication method of the semiconductor device according to the first embodiment of the present invention.

A schematic plane pattern configuration of a semiconductor device according to a first embodiment of the present invention is expressed as shown in FIG. 1. A schematic section structure explaining one process of a fabrication method of the semiconductor device according to the first embodiment is expressed as shown in FIG. 2 and FIG. 3. Moreover, FIG. 4 shows a schematic section structure to which the near of a source electrode 3 is enlarged.

The semiconductor device according to the first embodiment includes a semiconductor substrate 4A, a field effect transistor 4, and a hollow protective film 5, as shown in FIG. 1 to FIG. 4. The field effect transistor 4 includes a gate electrode 1, a drain electrode 2, and a source electrode 3 which are formed on the semiconductor substrate 4A. The hollow protective film 5 covers the gate electrode 1, the drain electrode 2, and the source electrode 3 of the field effect transistor 4, and is provided on the semiconductor substrate 4A. The hollow protective film 5 includes a first cap layer 7, a second cap layer 10, a plurality of openings 12, and a sealed part 12A. The second cap layer 10 is placed on the first cap layer 7. A plurality of openings 12 are formed on the position of the first cap layer 7 of the upper part of the drain electrode 2 and the source electrode 3. The sealed part 12A seals the openings 12 by the second cap layer 10.

Figure 4:
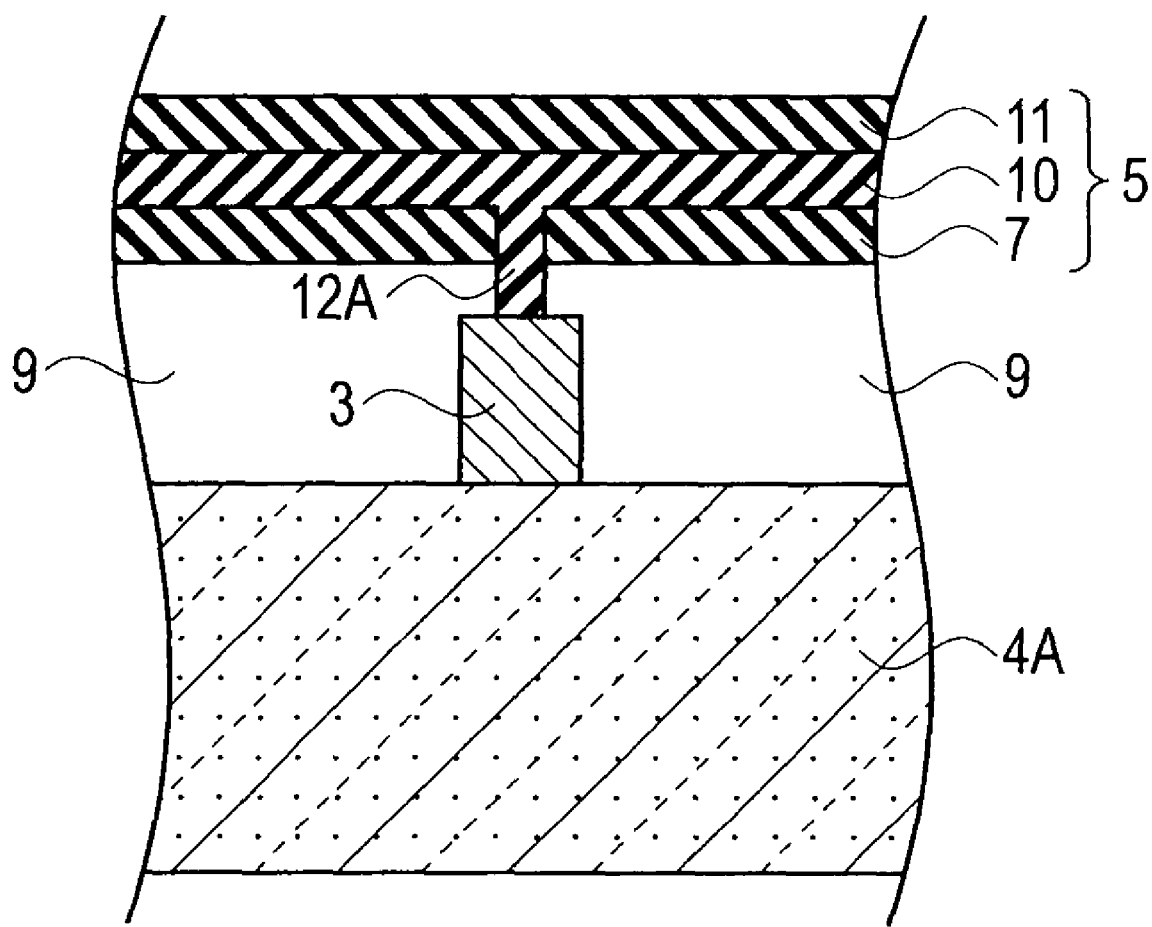
FIG. 4 is a schematic cross-sectional configuration chart to which the near of a source electrode of the semiconductor device according to the first embodiment of the present invention is enlarged.

In addition, although a plurality of openings 12 formed on the position of the first cap layer 7 of the upper part of the drain electrode 2 and the source electrode 3 are shown in the section structure of FIG. 2 and FIG. 4, a plurality of openings 12 are omitting illustration in the plane pattern of FIG. 1.

The hollow protective film 5 may further include a third cap layer 11 placed on the second cap layer 10.

The first cap layer 7 and the second cap layer 10 can compose an insulating film, for example, can be composed by a silicon dioxide film ($SiO_2$ film).

The third cap layer 11 can compose an insulating film, for example, can be composed by a silicon nitride film (SiN film).

As shown in FIG. 1 and FIG. 3, the field effect transistor 4 includes the hollow protective film 5, and the field effect transistor 4 including the gate electrode 1, the drain electrode 2, and the source electrode 3 is formed on the semiconductor substrate 4A. The hollow protective film 5 is provided on the semiconductor substrate 4A so that the polar zone composed of the gate electrode 1, the drain electrode 2, and the source electrode 3 of this field effect transistor 4 may be covered. Here, as shown in FIG. 3 and FIG. 4, a plurality of openings 12 are formed on the position of the first cap layer 7 of the upper part of the drain electrode 2 and the source electrode 3, and the sealed part 12A which seals this plurality of openings 12 by the second cap layer 10 is provided. The first cap layer 7 is isolated with the upper surface of the drain electrode 2 and the source electrode 3. That is, the inner surface of the first cap layer 7 is not provided so that it may bond with the upper surface of the drain electrode 2 and the source electrode 3.

(Fabrication Method)

As shown in FIG. 1 to FIG. 4, the fabrication method for the semiconductor device according to the first embodiment includes: the step of forming the field effect transistor 4 including the source electrode 3, the gate electrode 1, and the drain electrode 2 on the semiconductor substrate 4A; the step of forming the sacrifice layer 6 on the surface of the field effect transistor 4 so that the active part of the source electrode 3, the gate electrode 1, and the drain electrode 2 may be covered; the step of forming the first cap layer 7 on the sacrifice layer 6; the step of forming a plurality of openings 12 for removing the sacrifice layer 6 on the upper position of the drain electrode 2 and the source electrode 3 of the first cap layer 7; the step of removing the sacrifice layer 6 through a plurality of openings 12; and the step of sealing a plurality of openings 12 after removing the sacrifice layer 6.

The step of removing the sacrifice layer 6 includes the step of sending oxygen plasma through a plurality of openings 12, gasifying the sacrifice layer 6 by an oxygen plasma asher, and exhausting the sacrifice layer 6 from the opening 12 to external.

Moreover, the step of removing the sacrifice layer 6 further includes the step of forming the second cap layer 10 on the first cap layer 7, and sealing the openings 12.

It may include the step of forming a third cap layer 11 on the second cap layer 10.

Next, the fabrication method for the semiconductor device according to the first embodiment will be explained using FIG. 1 to FIG. 4.

(a) First of all, form the field effect transistor 4 composed of the gate electrode 1, the drain electrode 2, the source electrode 3, etc. on the semiconductor substrate 4A.

(b) Next, as shown in FIG. 2, form the sacrifice layer 6 composed of, for example, photosensitive polyimide on the drain electrode 2, the source electrode 3, the gate electrode 1, and the semiconductor substrate 4A. That is, after applying the sacrifice layer 6 completely on the semiconductor substrate 4A, it patterns toward this sacrifice layer 6 so that the active part of the gate electrode 1, the drain electrode 2, and the source electrode 3 may be covered. In addition, not only the photosensitive polyimide but other photosensitive heat-resistant materials may be sufficient as the sacrifice layer 6. Moreover, if heat treatment is not used for future steps, photosensitive materials, such as photoresist, may be sufficient.

(c) Next, as shown in FIG. 2, form the first cap layer 7 composed of an insulating film so that the sacrifice layer 6 may be covered on the upper part of the sacrifice layer 6. This first cap layer 7 can be formed, for example by depositing a silicon dioxide film by CVD (Chemical Vapor Deposition).

(d) Next, as shown in FIG. 2, further form the photoresist layer 8 composed of photosensitive materials on the upper part of the first cap layer 7.

(e) Next, as shown in FIG. 2, pattern the openings 12 on the first cap layer 7 located in each upper part of the drain electrodes 2 and the source electrode 3 except the gate electrode 1 by the photoresist layer 8.

(f) Next, through the photoresist layer 8 patterned in this way, perform etching removing of a part of the first cap layer 7 by RIE (Reactive Ion Etching) method, and form a plurality of openings 12. This plurality of openings 12 is formed the upper part of the source electrode 3 and the drain electrode 2 of the field effect transistor 4.

(g) Next, send the oxygen plasma through this plurality of the openings 12, and gasify the sacrifice layer 6 by an oxygen plasma asher. And then, the gasified sacrifice layer 6 is again exhausted external through the openings 12. Thus, the sacrifice layer 6 is removed and the hollow part (cavity part) 9 is formed. Although FIG. 3 is a sectional view of a field effect transistor 4 showing the state where this sacrifice layer 6 was removed and the hollow part 9 is formed, as shown in the same figure, the sacrifice layer 6 is removed from the active part of the source electrode 3, the drain electrode 2 the gate electrode 1, and the hollow part 9 is formed.

(h) Next, on the first cap layer 7, apply sealing resin completely as the second cap layer 10 after removing the photoresist layer 8 in order to fill up the openings 12. As the second cap layer 10, a silicon dioxide film may be made to deposit and the airtightness of the hollow part 9 may be secured by, for example, a spattering process, as an insulating film.

(i) Next, as shown in FIG. 3, deposit a nitride film as the third cap layer 11 by using, for example, plasma CVD, on the second cap layer 10. By the third cap layer 11, the airtightness and moisture resistance are securable. Thus, the hollow protective film 5 is formed by the first cap layer 7, second cap layer 10, and third cap layer 11.

In this case, the insulating film excellent in other moisture resistance and airtightness may be sufficient as the 3rd cap layer 11. Moreover, if the second cap layer 10 is provided with sufficient airtightness and moisture resistance, there may not be the third cap layer 11.

Thus, according to the first embodiment, since the openings 12 for removing the sacrifice layer 6 is provided on the upper part of the source electrode 3 and the drain electrode 2 of the field effect transistor 4, the oxygen plasma is supplied to the sacrifice layer 6 by displacement of the shortest distance. Therefore, the sacrifice layer 6 is removable by ashing and gasification in a short time.

Moreover, although the sealing agent used for the second cap layer 10 accumulates on the inside of the hollow protective film 5 through the openings 12, since it is limited to the region on the drain electrode 2 or the source electrode 3, the influence given on the electrical characteristics of the field effect transistor 4 can be reduced to the minimum.

As shown in FIG. 4, since the source electrode 3 may support the hollow protective film 5 from the inner side with the sealing agent of the second cap layer 10 formed in the sealed part 12A, the mechanical intensity of the hollow protective film 5 is reinforced. Similarly, with the sealing agent of the second cap layer 10 formed in the sealed part 12A also in the drain electrode 2, since the hollow protective film 5 is supported from the inner side, the mechanical intensity of the hollow protective film 5 is reinforced.

Since the hollow protective film 5 formed in this way has composition which the electrodes except active gate electrode 1, i.e., the drain electrode 2, and the source electrodes 3 supports electrically as a support unit, the mechanical strength of the hollow protective film 5 does not become weaker even if the volume of the hollow sections becomes large, and the bad influence of electrical characteristics is also eliminated.

According to the present invention, since the opening 12 for removing the sacrifice layer is provided distributing all over including the central part on the surface of the semiconductor device, the sacrifice layer 6 deposited on the semiconductor device surface is removable in a short time.

Moreover, since these openings 12 are formed in the upper position of the drain electrode 2 and the source electrode 3 of the hollow protective film 5 including the first cap layer 7, the sealing agent which fills up the openings 12 deposits on the limited region of only the drain electrode 2 or source electrode 3 inside the hollow protective film 5.

Since the capacity between the gate and source electrodes or the gate and drain electrode is made to increase if this sealing agent accumulates on near the gate electrode 1, a bad influence is given on the electrical characteristics of the field effect transistor 4. Therefore, since the sealing agent does not accumulate on the gate electrode 1 neighborhood according to the first embodiment, a semiconductor device of high reliability excellent in electrical characteristics can be fabricated.

According to the first embodiment, a semiconductor device and a fabrication method for the semiconductor device which can strengthen the mechanical strength of the protective film and with which packaging of the wafer level with electric high reliability is performed can be provided.

According to the first embodiment, a semiconductor device and a fabrication method for the semiconductor device which can remove the sacrifice layer in a short time and whose manufacturing yield improves can be provided.

Second Embodiment

Figure 5:
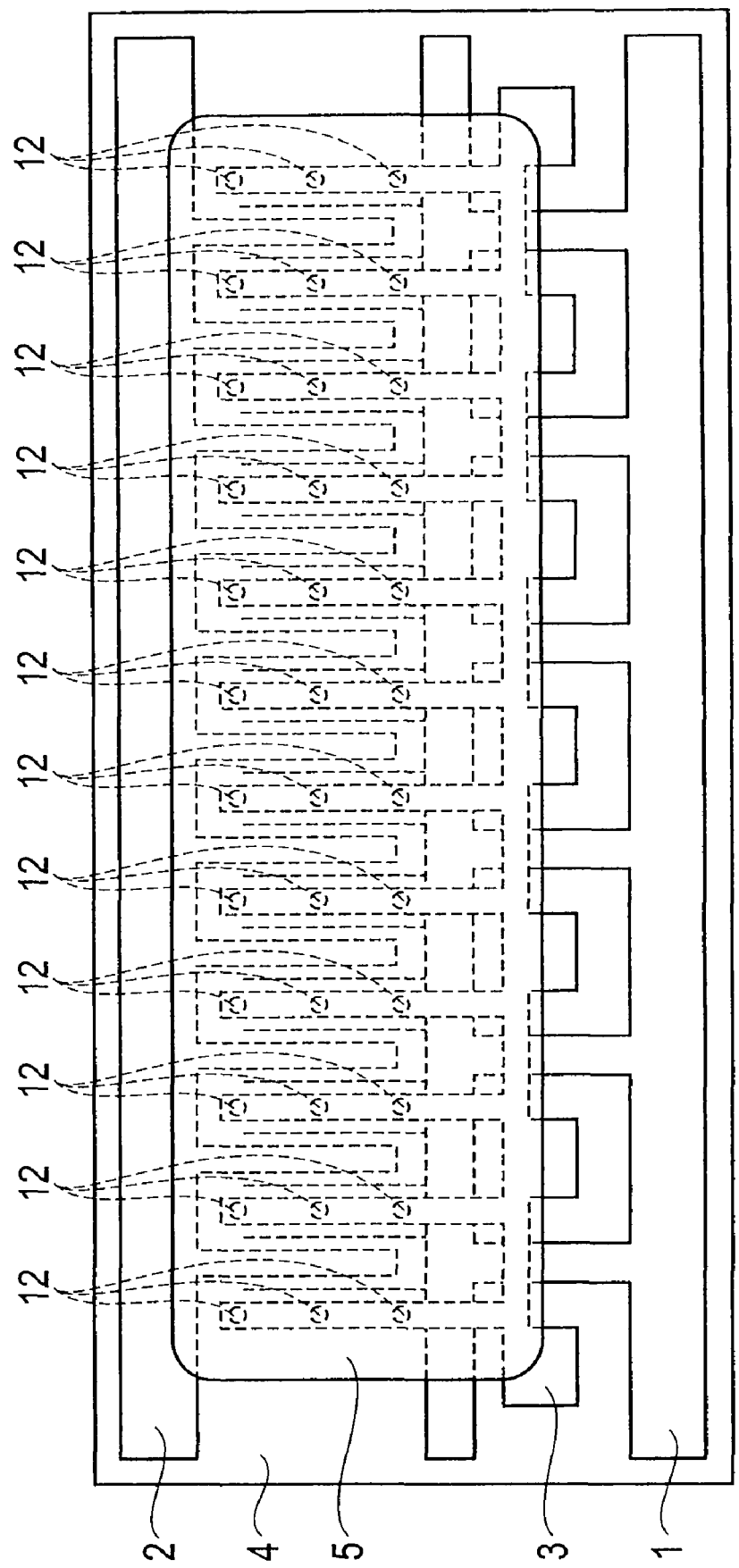
FIG. 5 is a detailed schematic plane pattern configuration diagram showing a semiconductor device according to a second embodiment of the present invention.

As shown in FIG. 5, a detailed schematic plane pattern configuration of a semiconductor device according to a second embodiment is an example by which a plurality of openings 12 are placed at the first cap layer 7 of the upper part of the source electrode 3, and other configurations are the same as that of the first embodiment. A plurality of openings 12 are shown by the dotted line in FIG. 5.

Modified Example 1

Figure 6:
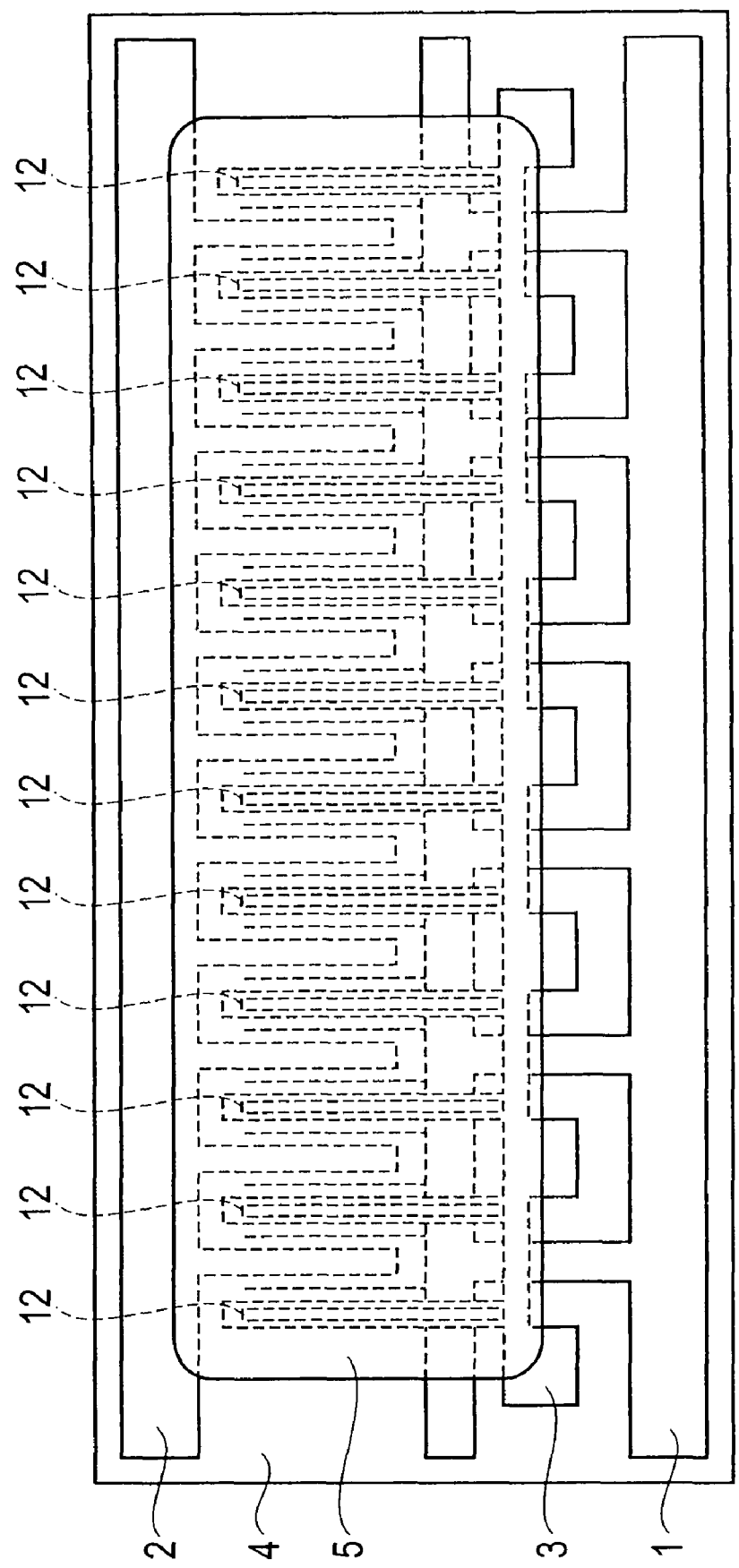
FIG. 6 is a detailed schematic plane pattern configuration diagram showing a semiconductor device according to a modified example 1 of the second embodiment of the present invention.

As shown in FIG. 6, a detailed schematic plane pattern configuration of a semiconductor device according to a modified example 1 of the second embodiment is an example by which the openings 12 are placed at rectangle stripe shape at the first cap layer 7 of the upper part of the source electrode 3, and other configurations are the same as that of the first embodiment.

Modified Example 2

Figure 7:
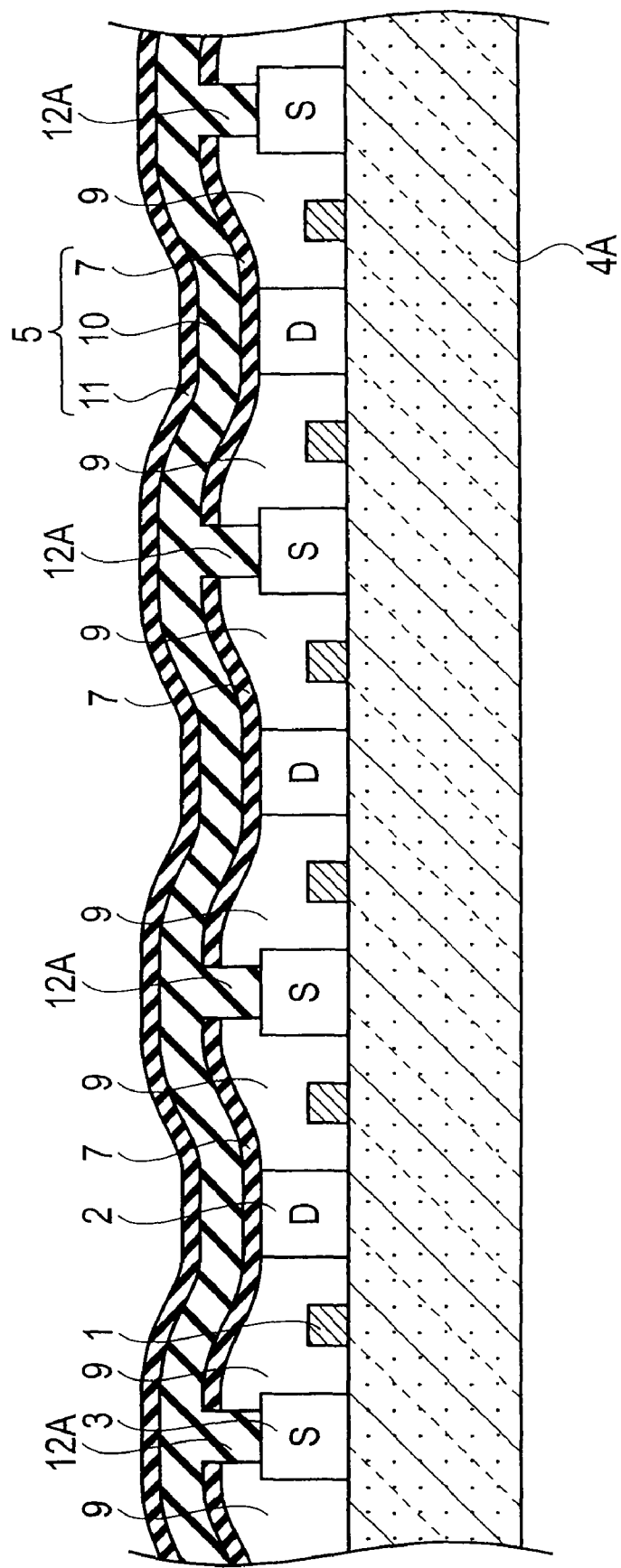
FIG. 7 is a schematic cross section configuration diagram showing a semiconductor device according to a modified example 2 of the second embodiment of the present invention.

As for a schematic section structure of a semiconductor device according to a modified example 2 of the second embodiment, as shown in FIG. 7, the openings 12 are formed in the first cap layer 7, in the upper position of the source electrode 3, and also the inner surface of the first cap layer 7 is in contact with the upper surface of the drain electrode 2. Other configurations are the same as that of the first embodiment.

Modified Example 3

Figure 8:
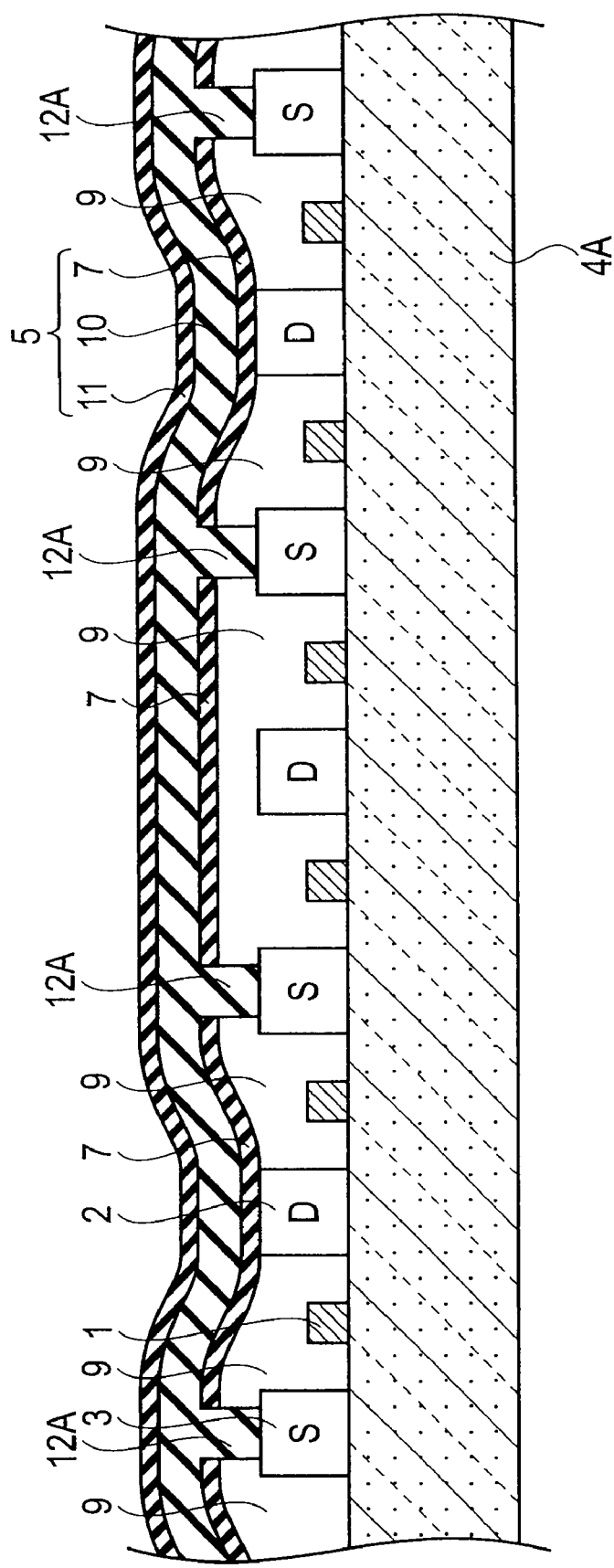
FIG. 8 is a schematic cross section configuration diagram showing a semiconductor device according to a modified example 3 of the second embodiment of the present invention.

As for a schematic section structure of a semiconductor device according to a modified example 3 of the second embodiment, as shown in FIG. 8, the hollow protective film 5 contacts the inner surface of the first cap layer 7, in the upper surface of a part of the drain electrodes 2. That is, for example, the inner surface of the first cap layer 7 contacts by every other one among a plurality of drain electrodes 2 placed at stripe shape. Other configurations are the same as that of the modified example 2.

According to the second embodiment, a semiconductor device and a fabrication method for the semiconductor device which could strengthen the mechanical strength of the protective film and with which packaging of the wafer level with electric high reliability is performed can be provided.

According to the second embodiment, a semiconductor device and a fabrication method for the semiconductor device which can remove the sacrifice layer in a short time and whose manufacturing yield improves can be provided.

Third Embodiment

Figure 9:
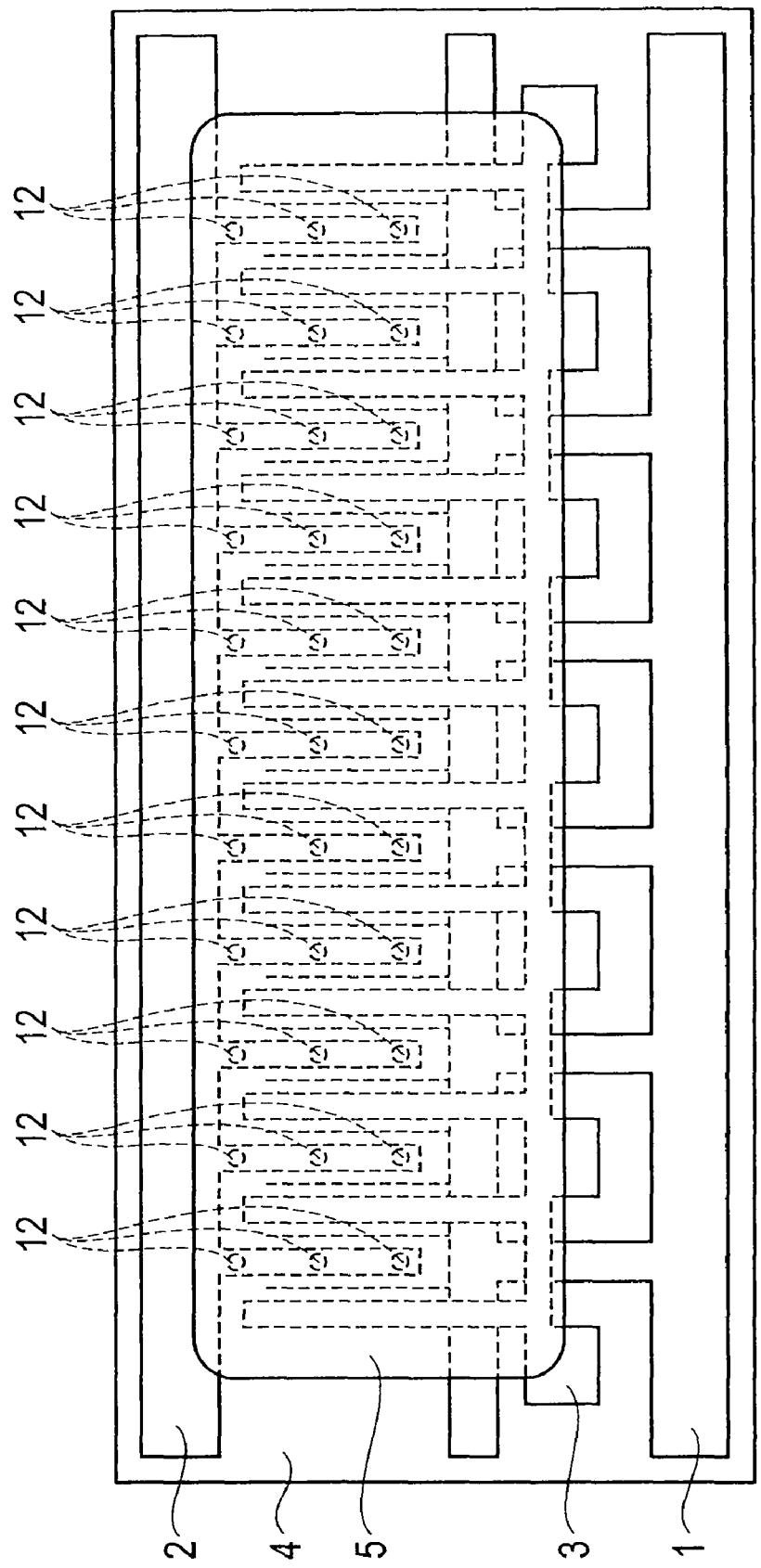
FIG. 9 is a detailed schematic plane pattern configuration diagram showing a semiconductor device according to a third embodiment of the present invention.

As shown in FIG. 9, a detailed schematic plane pattern configuration of a semiconductor device according to a third embodiment is an example by which a plurality of openings 12 are placed at the first cap layer 7 of the upper part of the drain electrode 2, and other configurations are the same as that of the first embodiment. A plurality of openings 12 are shown by the dotted line also in FIG. 9.

Modified Example 1

Figure 10:
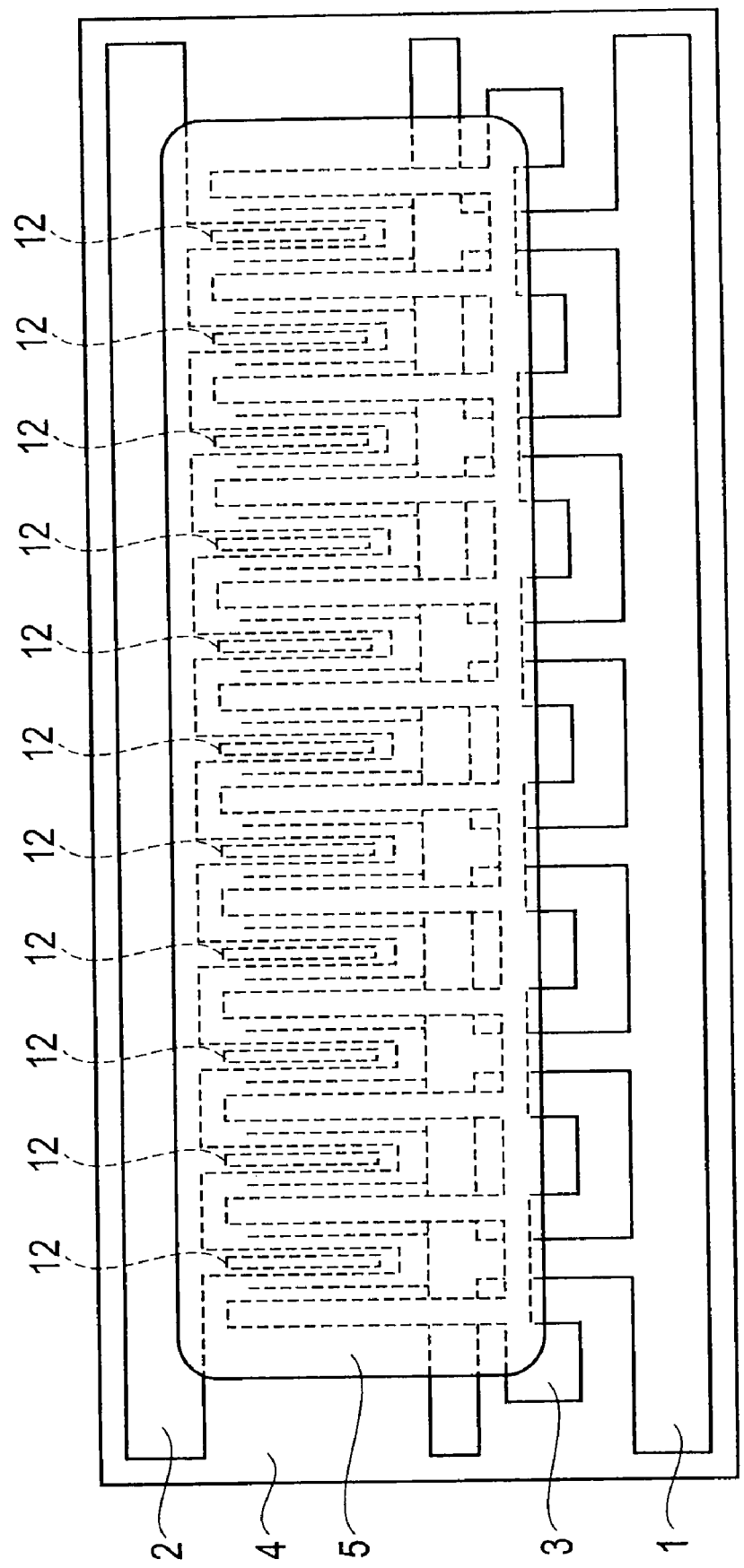
FIG. 10 is a detailed schematic plane pattern configuration diagram of a semiconductor device according to a modified example 1 of the third embodiment of the present invention.

As shown in FIG. 10, a detailed schematic plane pattern configuration of a semiconductor device according to a modified example 1 of the third embodiment is an example by which the openings 12 are placed at rectangle stripe shape at the first cap layer 7 of the upper part of the drain electrode 2, and other configurations are the same as that of the first embodiment.

Modified Example 2

Figure 11:
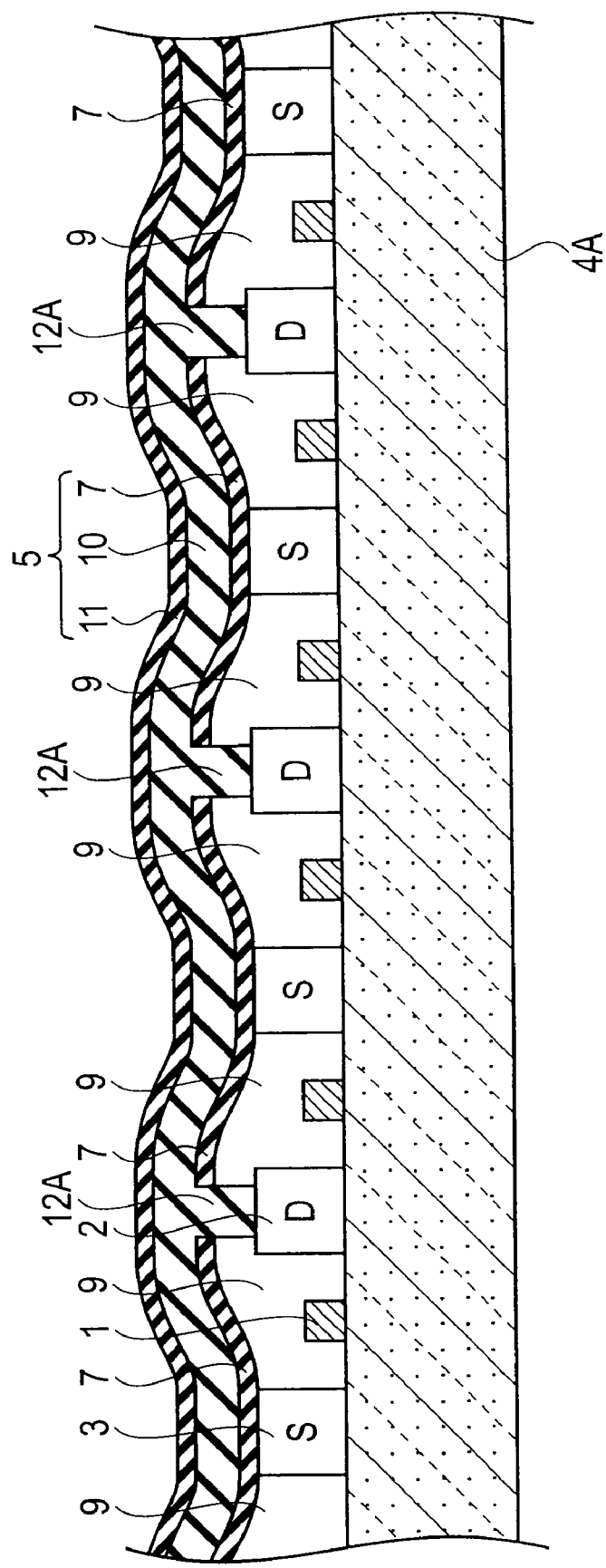
FIG. 11 is a schematic cross section configuration diagram showing a semiconductor device according to a modified example 2 of the third embodiment of the present invention.

As for a schematic section structure of a semiconductor device according to a modified example 2 of the third embodiment, as shown in FIG. 11, the openings 12 are formed in the first cap layer 7, in the upper position of the drain electrode 2, and also the inner surface of the first cap layer 7 is in contact with the upper surface of the source electrode 3. Other configurations are the same as that of the first embodiment.

Modified Example 3

Figure 12:
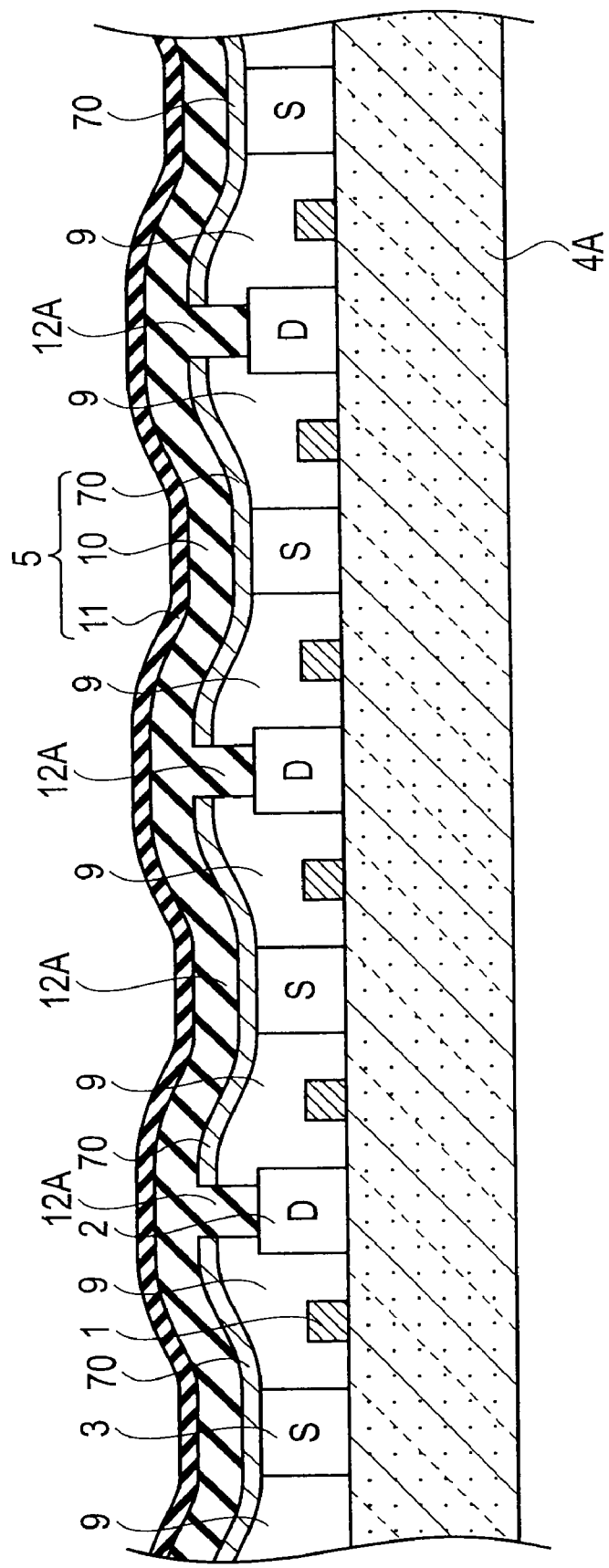
FIG. 12 is a schematic cross section configuration diagram showing a semiconductor device according to a modified example 3 of the third embodiment of the present invention.

As shown in FIG. 12, a schematic section structure of the semiconductor device according to a modified example 3 of the third embodiment shows an example which forms the first cap layer 70 that contacts the source electrode 3 by using a metal layer. That is, a semiconductor device which an electric shielding effect is obtained, is stabilized electrically, and is high reliability can be formed by forming the first cap layer 70 that contacts the source electrode 3 by using a metal layer. Other configurations are the same as that of the modified example 2.

In addition, a configuration which the inner surface of the first cap layer 70 contacts by every other one as well as FIG. 8 among a plurality of source electrodes 3 placed at stripe shape is also adoptable.

According to the third embodiment, a semiconductor device and a fabrication method for the semiconductor device which can strengthen the mechanical strength of the protective film and with which packaging of the wafer level with electric high reliability is performed can be provided.

According to the third embodiment, a semiconductor device and a fabrication method for the semiconductor device which can remove the sacrifice layer in a short time and whose manufacturing yield improves can be provided.

Fourth Embodiment

Figure 13:
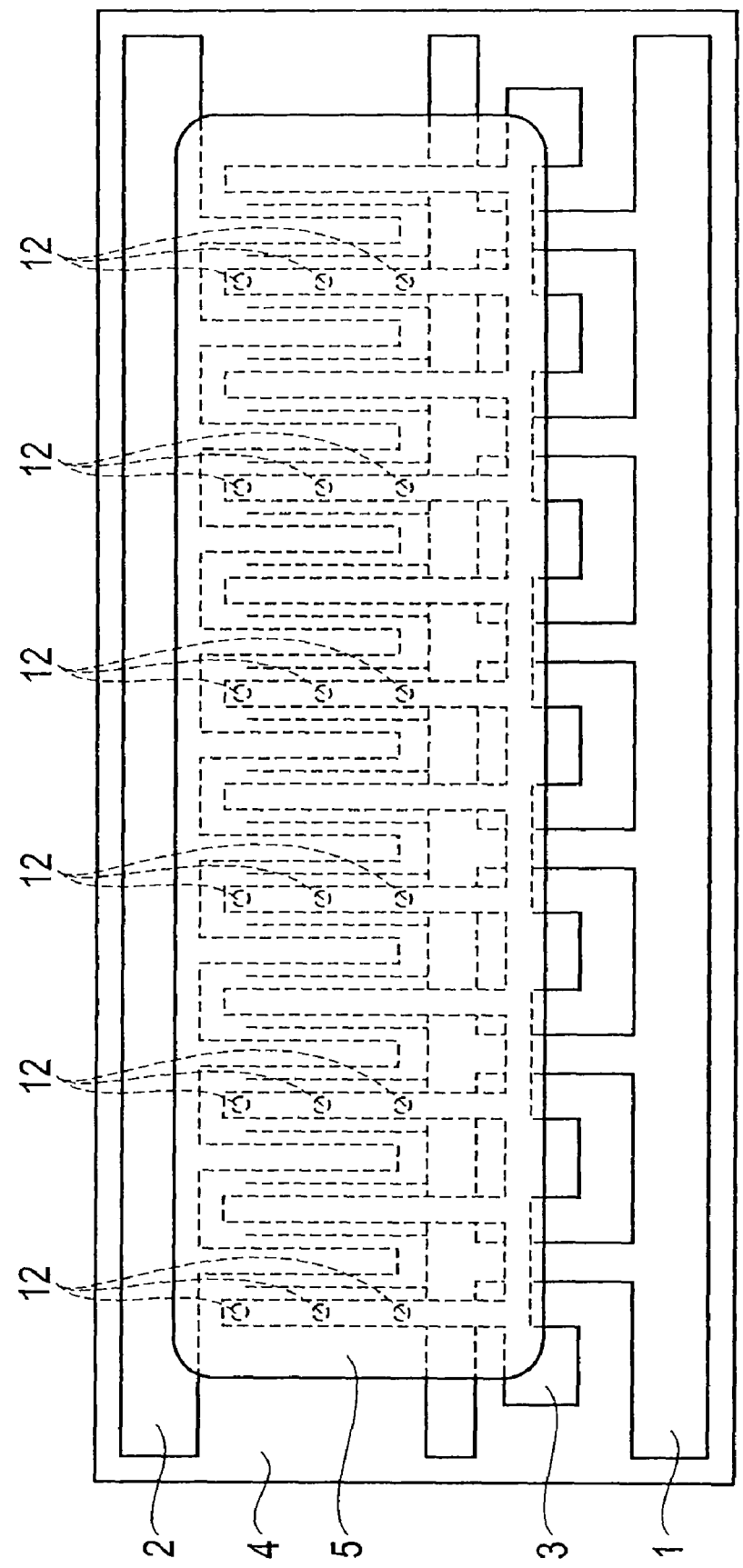
FIG. 13 is a detailed schematic plane pattern configuration diagram showing a semiconductor device according to a fourth embodiment of the present invention.

As shown in FIG. 13, a detailed schematic plane pattern configuration of a semiconductor device according to a fourth embodiment is an example that a plurality of openings 12 are placed by every other one among the source electrodes 3 placed at stripe shape at the first cap layer 7 of the upper part of the source electrode 3. Other configurations are the same as that of the first embodiment.

Modified Example 1

Figure 14:
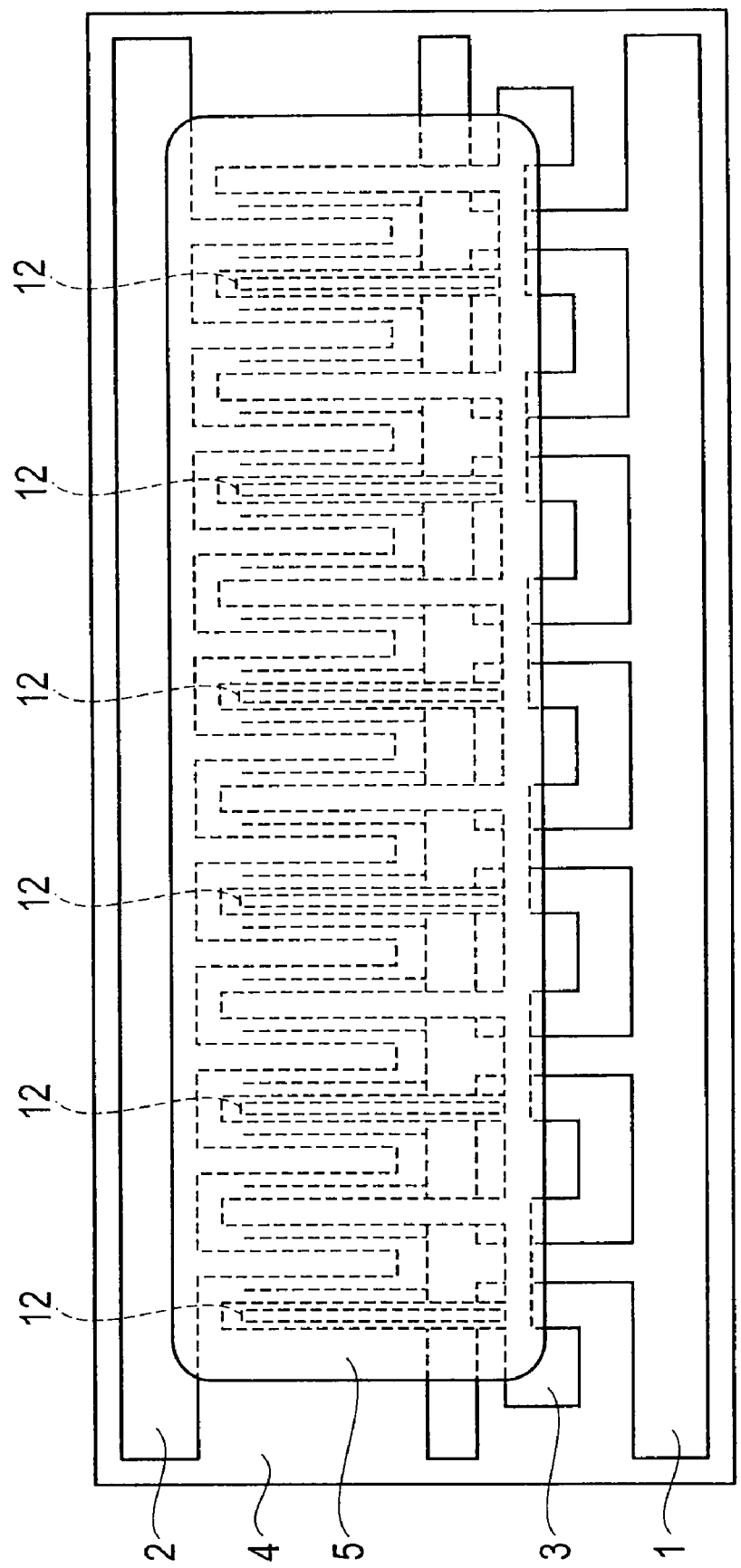
FIG. 14 is a detailed schematic plane pattern configuration diagram showing a semiconductor device according to a modified example 1 of the fourth embodiment of the present invention.

As shown in FIG. 14, a detailed schematic plane pattern configuration of a semiconductor device according to a modified example 1 of the fourth embodiment is an example that the opening 12 is placed by every other one, among the source electrodes 3 placed at stripe shape, at rectangle stripe shape at the first cap layer 7 of the upper part of the source electrode 3. Other configurations are the same as that of the first embodiment.

Modified Example 2

Figure 15:
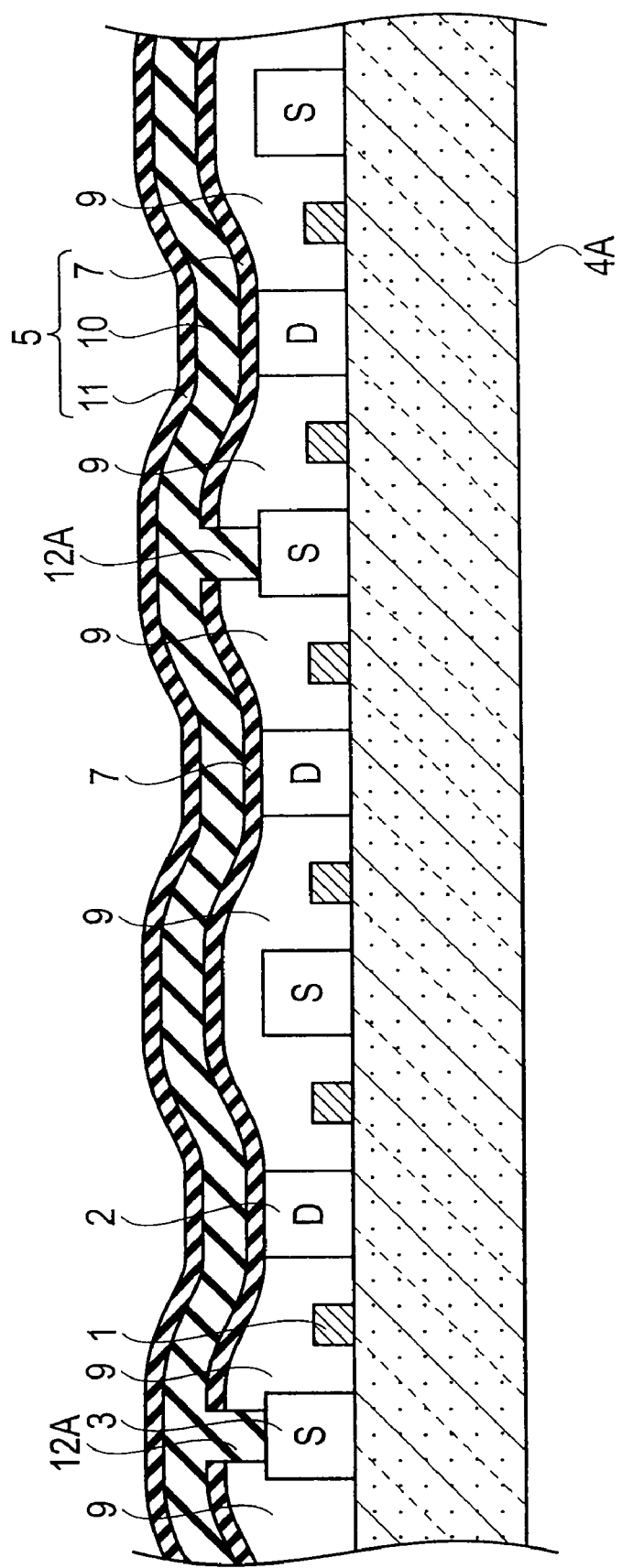
FIG. 15 is a schematic cross section configuration diagram showing a semiconductor device according to a modified example 2 of the fourth embodiment of the present invention.

As for a schematic section structure of a semiconductor device according to a modified example 2 of the fourth embodiment, as shown in FIG. 15, the opening 12 is formed in the upper position of the source electrode 3 by every other one at the first cap layer 7 among the source electrodes 3 placed at stripe shape, and also the inner surface of the first cap layer 7 is in contact with the upper surface of the drain electrode 2. Other configurations are the same as that of the first embodiment.

Modified Example 3

Figure 16:
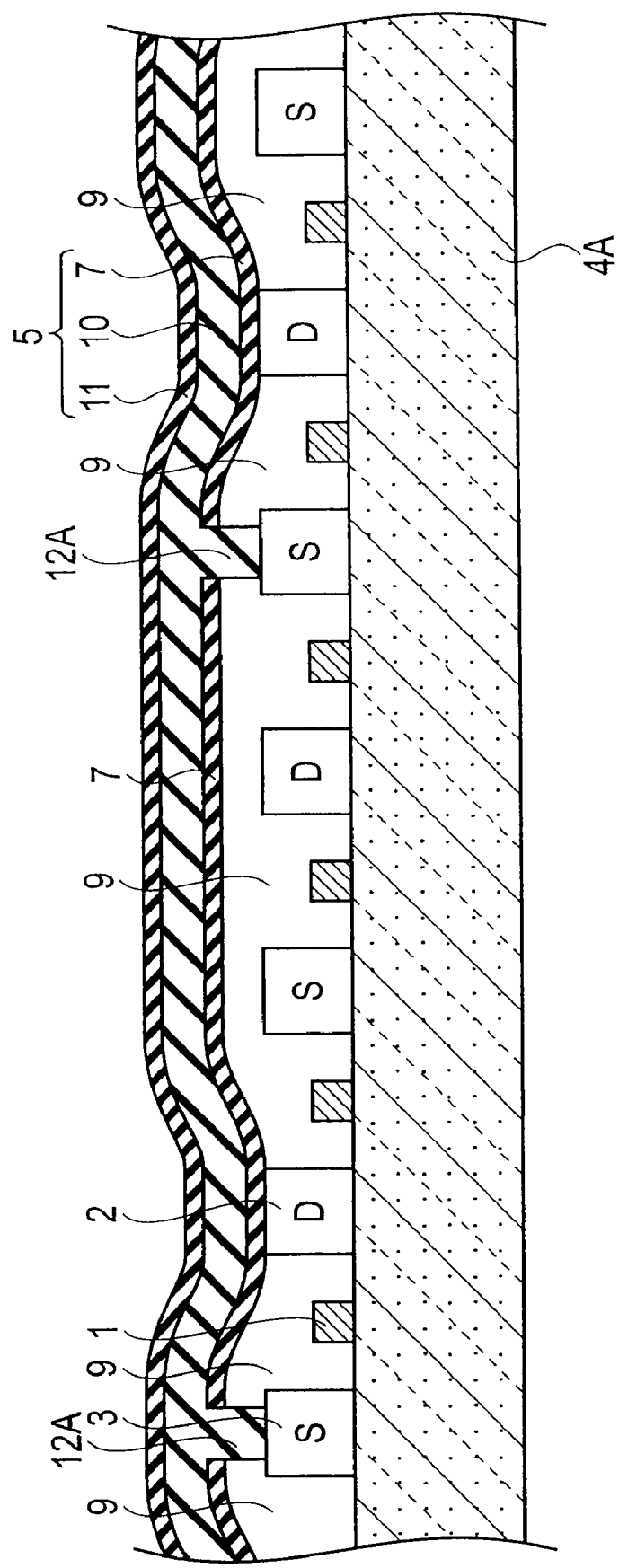
FIG. 16 is a schematic cross section configuration diagram showing a semiconductor device according to a modified example 3 of the fourth embodiment of the present invention.

As for a schematic section structure of a semiconductor device according to a modified example 3 of the fourth embodiment, as shown in FIG. 16, the hollow protective film 5 contacts to the inner surface of the first cap layer 7 in the upper surface of a part of the drain electrodes 2. That is, for example, the inner surface of the first cap layer 7 contacts by every other one among a plurality of drain electrodes 2 placed at stripe shape. Other configurations are the same as that of the modified example 2.

According to the fourth embodiment, a semiconductor device and a fabrication method for the semiconductor device which could strengthen the mechanical strength of the protective film and with which packaging of the wafer level with electric high reliability is performed can be provided.

According to the fourth embodiment, a semiconductor device and a fabrication method for the semiconductor device which can remove the sacrifice layer in a short time and whose manufacturing yield improves can be provided.

Fifth Embodiment

Figure 17:
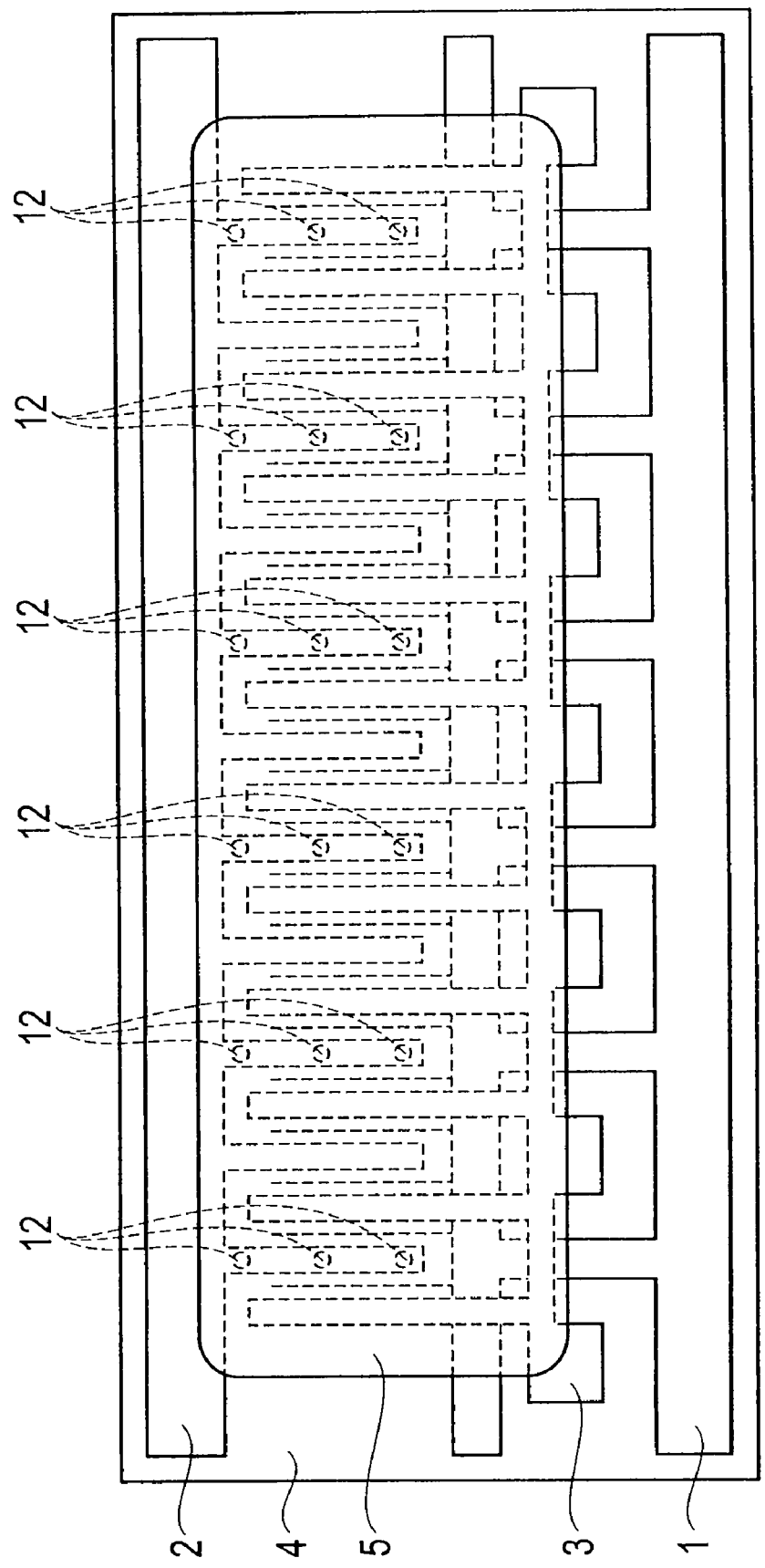
FIG. 17 is a detailed schematic plane pattern configuration diagram showing a semiconductor device according to a fifth embodiment of the present invention.

As shown in FIG. 17, a detailed schematic plane pattern configuration of a semiconductor device according to a fifth embodiment is an example that a plurality of openings 12 are placed by every other one, among the drain electrodes 2 placed at stripe shape, at the first cap layer 7 of the upper part of the drain electrode 2. Other configurations are the same as that of the first embodiment.

Modified Example 1

Figure 18:
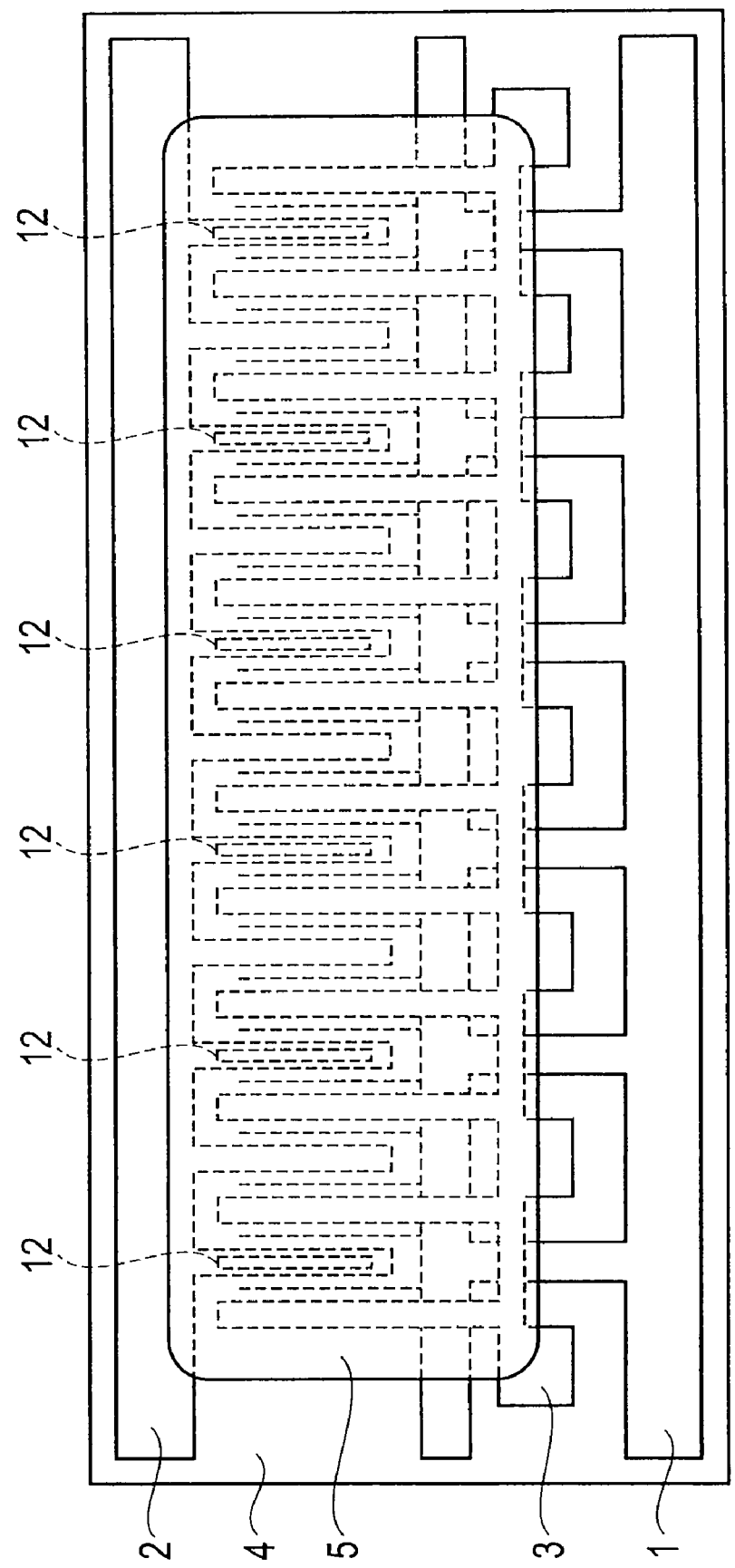
FIG. 18 is a detailed schematic plane pattern configuration diagram showing a semiconductor device according to a modified example 1 of the fifth embodiment of the present invention.

As shown in FIG. 18, a detailed schematic plane pattern configuration of a semiconductor device according to a modified example 1 of the fifth embodiment is an example that the opening 12 is placed by every other one, among the drain electrodes 2 placed at stripe shape, at rectangle stripe shape at the first cap layer 7 of the upper part of the drain electrode 2. Other configurations are the same as that of the first embodiment.

Modified Example 2

Figure 19:
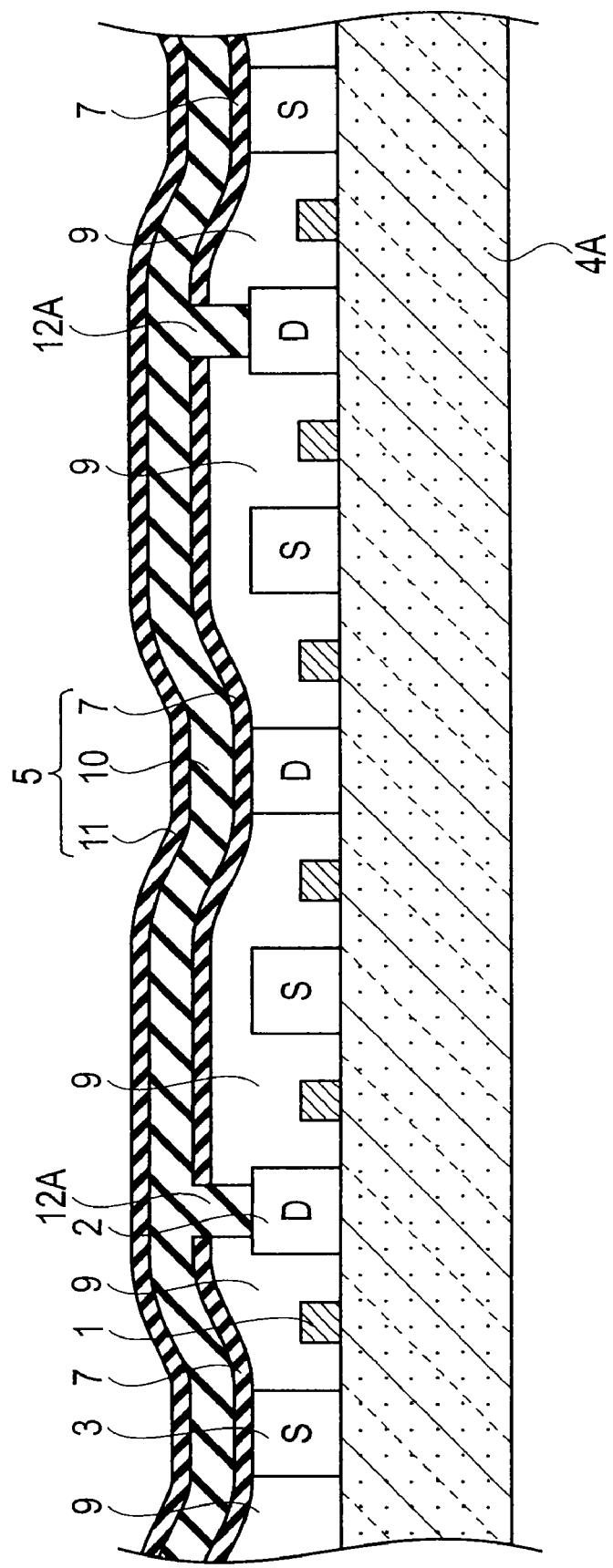
FIG. 19 is a schematic cross section configuration diagram showing a semiconductor device according to a modified example 2 of the fifth embodiment of the present invention.

As shown in FIG. 19, as for a schematic section structure of a semiconductor device according to a modified example 2 of the fifth embodiment, the openings 12 is formed in the upper position of the drain electrode 2 by every other one, among the drain electrodes 2 placed at stripe shape, at the first cap layer 7, and also the inner surface of the first cap layer 7 is in contact with the upper surface of a part of the source electrodes 3 and the drain electrode 2. Other configurations are the same as that of the first embodiment.

Modified Example 3

Figure 20:
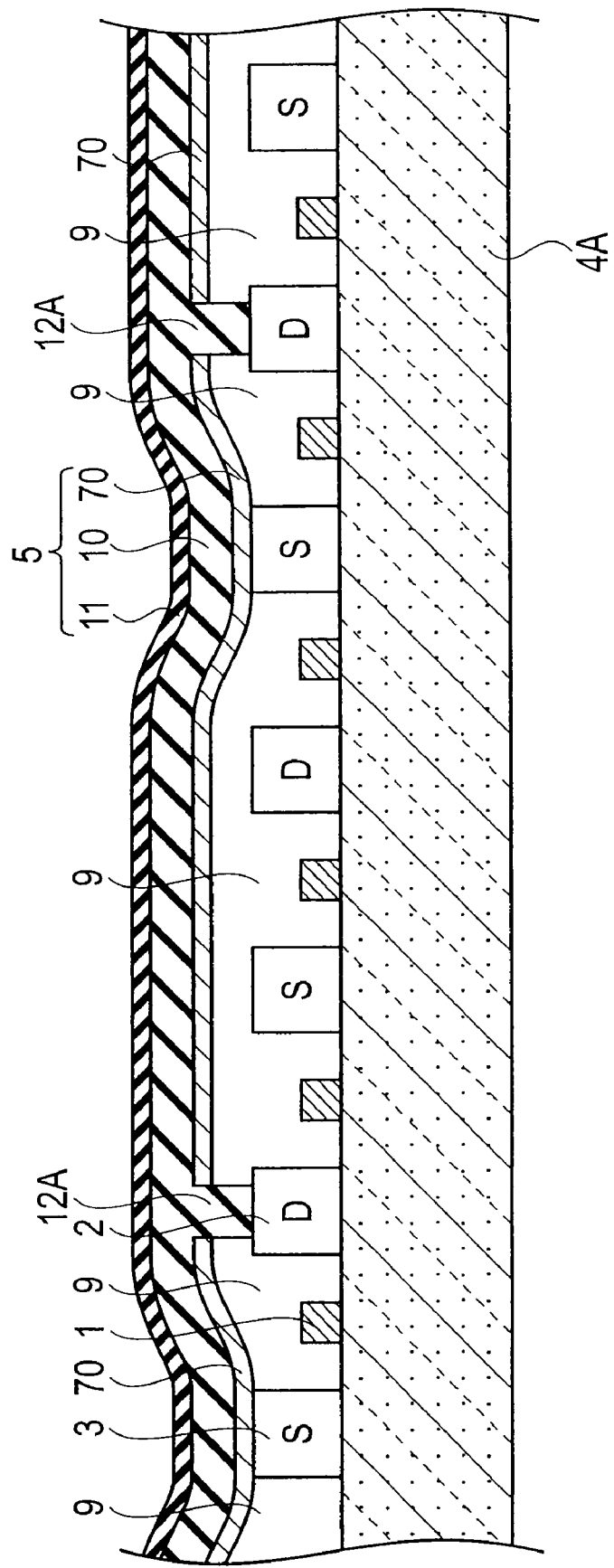
FIG. 20 is a schematic cross section configuration diagram showing a semiconductor device according to a modified example 3 of the fifth embodiment of the present invention.

As shown in FIG. 20, a schematic section structure of the semiconductor device according to a modified example 3 of the fifth embodiment shows an example which forms the first cap layer 70 that contacts the source electrode 3 by using a metal layer. That is, a semiconductor device which an electric shielding effect is obtained, is stabilized electrically, and is high reliability can be formed by forming the first cap layer 70 that contacts the source electrode 3 by using a metal layer. In addition, a configuration which the inner surface of the first cap layer 70 contacts by every other one among a plurality of source electrodes 3 placed at stripe shape is adopted. As for the hollow protective film 5, the inner surface of the first cap layer 7 contacts in the upper surface of a part of the drain electrodes 2. That is, for example, the inner surface of the first cap layer 70 contacts by every other one among a plurality of drain electrodes 2 placed at stripe shape. Other configurations are the same as that of the modified example 2.

According to the fifth embodiment, a semiconductor device and a fabrication method for the semiconductor device which could strengthen the mechanical strength of the protective film and with which packaging of the wafer level with electric high reliability is performed can be provided.

According to the fifth embodiment, a semiconductor device and a fabrication method for the semiconductor device which can remove the sacrifice layer in a short time and whose manufacturing yield improves can be provided.

Other Embodiments

While the present invention is described in accordance with the aforementioned first through fifth embodiments, it should not be understood that the description and drawings that configure part of this disclosure are to limit the present invention. This disclosure makes clear a variety of alternative embodiments, working examples, and operational techniques for those skilled in the art.

For example, it is not necessary to provide the openings 12 in the upper position of all the drain electrodes 2 or source electrodes 3, and especially the number provided corresponding to each electrode is not limited, either.

Such being the case, the present invention covers a variety of embodiments, whether described or not.

INDUSTRIAL APPLICABILITY

According to the present invention, a semiconductor device has a wide range of application fields, such as an internally matched power amplifier, a power MMIC (Monolithic Microwave Integrated Circuit), a microwave power amplifier, a millimeter-wavepower amplifier, and a high frequency MEMS (Micro Electro Mechanical Systems) device.

What is claimed is:

1. A semiconductor device comprising:
a semiconductor substrate;
a field effect transistor including a gate electrode, a drain electrode, and a source electrode which are formed on the semiconductor substrate; and
a hollow protective film for covering the gate electrode, the drain electrode, and the source electrode of the field effect transistor, and provided on the semiconductor substrate, wherein
the hollow protective film comprises a first cap layer; a second cap layer placed on the first cap layer; a plurality of openings formed in the position of the first cap layer of an upper part of the drain electrode and the source electrode; and a sealed part for sealing the openings by the second cap layer.

2. The semiconductor device according to claim 1, wherein the hollow protective film further comprises a third cap layer placed on the second cap layer.

3. The semiconductor device according to claim 1, wherein the first cap layer and the second cap layer are composed of a silicon dioxide film.

4. The semiconductor device according to claim 2, wherein the third cap layer is composed of a silicon nitride film.

5. A semiconductor device comprising:
a semiconductor substrate;
a field effect transistor including a gate electrode, a drain electrode, and a source electrode which are formed on the semiconductor substrate; and
a hollow protective film for covering the gate electrode, the drain electrode, and the source electrode of the field effect transistor, and provided on the semiconductor substrate, wherein
the hollow protective film comprises a first cap layer; a second cap layer placed on the first cap layer; a plurality of openings formed in the position of the first cap layer of an upper part of anyone of the drain electrode and the source electrode; and a sealed part for sealing the openings by the second cap layer.

6. The semiconductor device according to claim 5, wherein the hollow protective film further comprises a third cap layer placed on the second cap layer.

7. The semiconductor device according to claim 5, wherein the first cap layer and the second cap layer are composed of a silicon dioxide film.

8. The semiconductor device according to claim 5, wherein the first cap layer is composed of a metal layer, and the second cap layer is composed of a silicon dioxide film.

9. The semiconductor device according to claim 6, wherein the third cap layer is composed of a silicon nitride film.

* * * * *